United States Patent
Palomo

(10) Patent No.: US 7,957,156 B2
(45) Date of Patent: Jun. 7, 2011

(54) BUSBAR CIRCUIT BOARD ASSEMBLY

(75) Inventor: Antonio Palomo, Tarragona (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 11/890,331

(22) Filed: Aug. 6, 2007

(65) Prior Publication Data

US 2009/0042419 A1    Feb. 12, 2009

(51) Int. Cl.
*H05K 7/00*    (2006.01)

(52) U.S. Cl. .................................... 361/779; 439/632

(58) Field of Classification Search ............ 439/84, 439/632; 361/637, 639, 775, 779
See application file for complete search history.

(56) References Cited

U.S. PATENT DOCUMENTS

| | | | | |
|---|---|---|---|---|
| 4,206,964 A | * | 6/1980 | Olsson | 439/873 |
| 4,353,609 A | * | 10/1982 | Haas | 439/82 |
| 4,526,429 A | | 7/1985 | Kirkman | |
| 4,585,285 A | * | 4/1986 | Martens | 439/62 |
| 4,795,353 A | | 1/1989 | Baker | |
| 5,263,247 A | | 11/1993 | Adachi et al. | |
| 6,530,811 B1 | | 3/2003 | Padulo et al. | |
| 6,997,737 B2 | | 2/2006 | Hiwatashi | |
| 7,074,094 B2 | | 7/2006 | Kawahara et al. | |
| 2001/0051450 A1 | * | 12/2001 | Ross | 439/78 |
| 2007/0167037 A1 | | 7/2007 | Thiel et al. | |

FOREIGN PATENT DOCUMENTS

| | | |
|---|---|---|
| DE | 34 33 038 | 3/1986 |
| EP | 0 388 478 | 9/1990 |
| JP | 10-292254 | 11/1998 |
| JP | 2003283093 | 10/2003 |

* cited by examiner

*Primary Examiner* — Edwin A. Leon
*Assistant Examiner* — Vanessa Girardi
(74) *Attorney, Agent, or Firm* — MacMillan, Sobanski & Todd, LLC

(57) ABSTRACT

An electrical connection assembly includes a substrate having first and second sides and a substrate aperture formed therein. The substrate is made of an electrically non-conductive material. A busbar is attached to the first side of the substrate. The busbar has a busbar aperture formed therein. A trace is formed on the second surface of the substrate. The busbar and trace are formed of an electrically conductive material. A pin is disposed in both the substrate aperture and the busbar aperture, wherein the pin is in electrical communication with the busbar and the trace.

16 Claims, 2 Drawing Sheets

US 7,957,156 B2

BUSBAR CIRCUIT BOARD ASSEMBLY

BACKGROUND OF THE INVENTION

This invention relates in general to printed circuit boards for use in power distribution circuits and junction boxes. In particular, this invention relates to an improved electrical power connection between the printed circuit board and cooperating connectors.

Printed circuit boards (PCB) are widely used to mechanically support and electrically connect electronic components and electronic circuits. Printed circuit boards are often rugged, inexpensive and highly reliable in various applications including transportation devices, such as automobiles. When used in such applications, printed circuit boards are used for many purposes including control circuits, monitoring circuits, junction boxes and power distribution.

A printed circuit board typically connects electronic components and electronic circuits using conductive pathways, or traces. The traces may be etched from copper sheets which are laminated onto a non-conductive substrate. A wide variety of solid state electronic components, including resistors, capacitors, thyristors, rectifiers, diodes and transistors can be connected to the printed circuit board and electrically to each other through the traces.

To provide the electrical connection between the electrical component and the traces, it is common to use electrical wiring therebetween. An electrical connector is connected to the end of the wire which in turn is connected to the traces. An example of this type of connection is shown and described in U.S. Pat. No. 4,526,429. U.S. Pat. No. 4,526,429 discloses a PCB having a non-conductive substrate sheet that includes a plurality of traces formed thereon. The substrate has a plurality of apertures formed therein defining an inner wall. The inner wall is lined with the electrically conductive material forming the traces. A compliant pin is frictionally held in place by resiliently contacting the lined inner wall of the substrate. The compliant pin can then be connected to a wire or other electrical member for connecting to an electrical component to the trace.

Although these types of connections generally perform well, for certain relatively high electrical current applications (e.g., power distribution within an automobile), the traces and lining must have a sufficient thickness to handle these relatively large amounts of electrical power. Thus, for traces which are to handle a relatively large amount of electrical power, the thickness and/or cross-sectional area of the trace is larger than a trace handling lesser amounts of electrical power.

While printed circuit boards can be relatively inexpensive to manufacturer, printed circuit boards incorporating traces capable of handling a large amount of electrical power are relatively more expensive due to the relatively larger amount of trace material and increase in manufacturing cost.

SUMMARY OF THE INVENTION

This invention relates to an electrical connection assembly including a substrate having first and second sides and a substrate aperture formed therein. The substrate is made of an electrically non-conductive material. A busbar is attached to the first side of the substrate. The busbar has a busbar aperture formed therein. A trace is formed on the second surface of the substrate. The busbar and trace are formed of an electrically conductive material. A pin is disposed in both the substrate aperture and the busbar aperture, wherein the pin is in electrical communication with the busbar and the trace.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
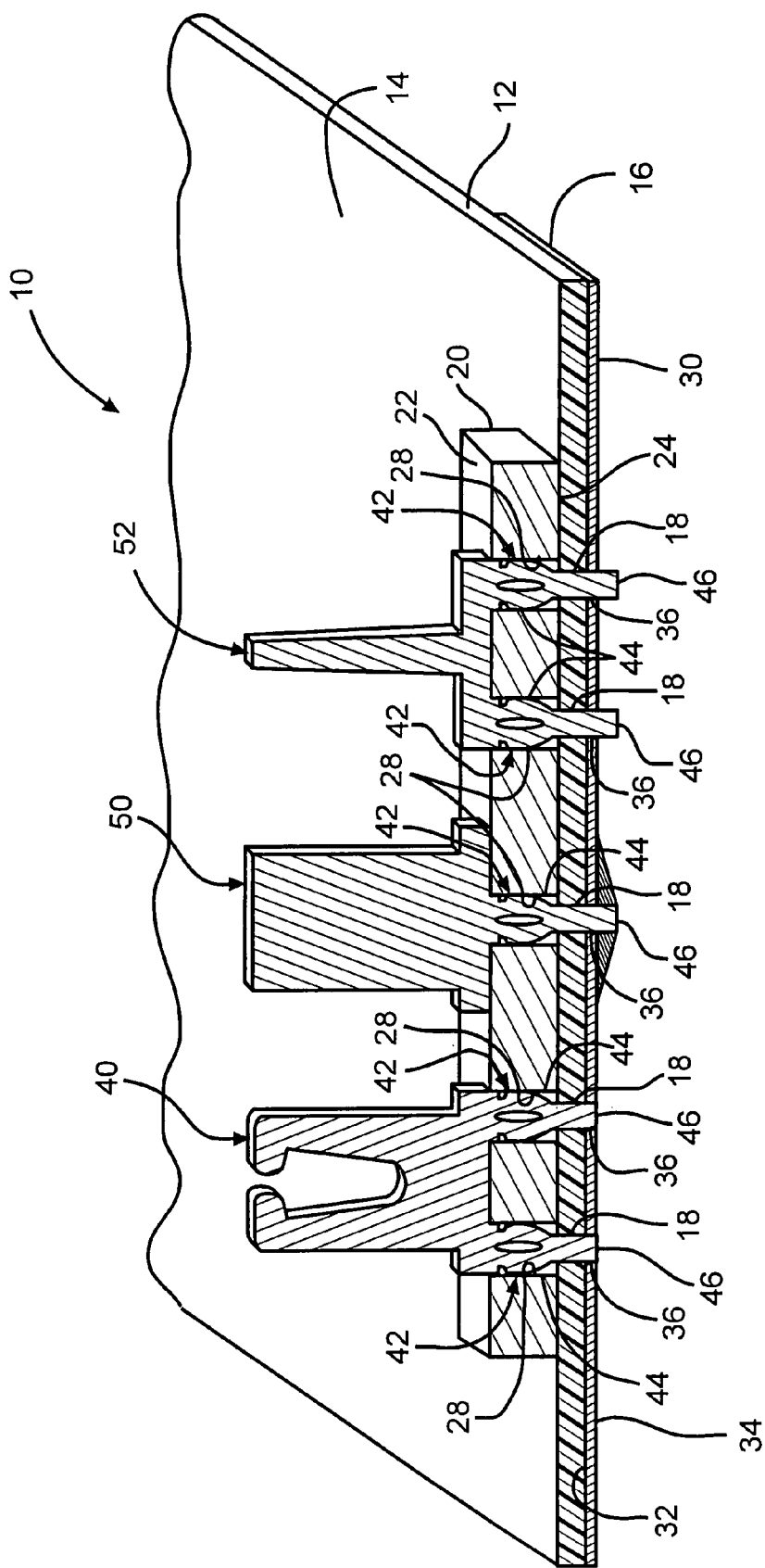
FIG. 1 is an enlarged perspective view, shown partially in cross-section, of an electrical connection assembly in accordance with this invention.
Figure 2:
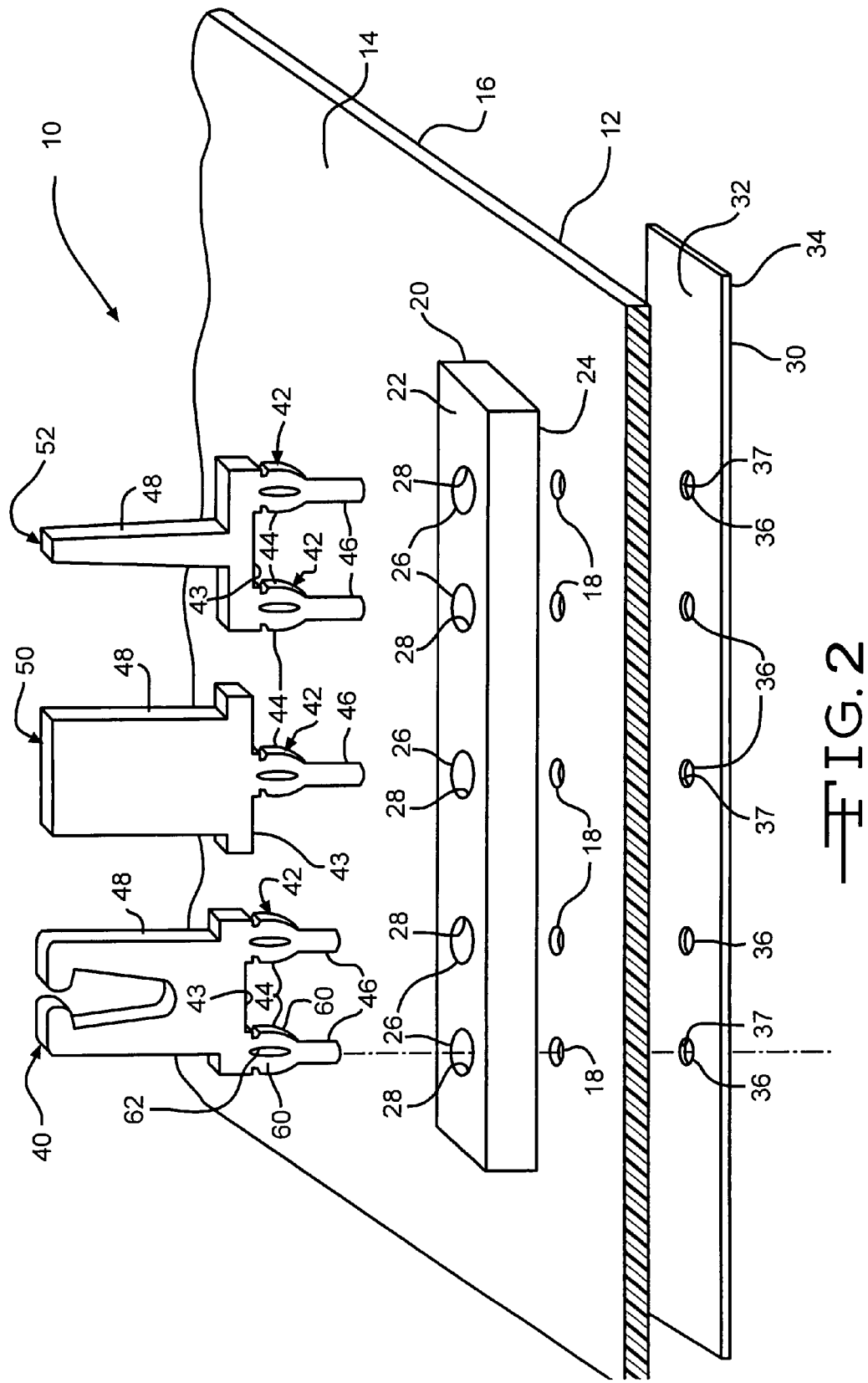
FIG. 2 is an enlarged, exploded perspective view of the electrical connection assembly illustrated in FIG. 1.

Referring now to the drawings, there is illustrated in FIGS. 1 and 2, an electrical connection assembly, indicated generally at 10, which is generally in the form of a printed circuit board. The assembly 10 is suited for use in vehicle power distribution circuits and junction boxes. As will be explained in detail below, the electrical connection assembly 10 is adapted to provide an efficient electrical power connection.

The electrical connection system 10 includes a substrate 12 which is generally in the form of a relatively thin planar sheet. The substrate 12 may be completely formed from a single electrically non-conductive material, or may be formed from a plurality of electrically conductive layers (not shown) separated and supported by layers of electrically non-conductive insulating material (not shown).

As further shown in FIGS. 1 and 2, the substrate 12 has a first substrate side 14 and a second substrate side 16. The first substrate side 14 and the second substrate side 16 are substantially parallel to each other, although such is not necessary for the invention.

The substrate 12 includes a plurality of substrate apertures 18 formed therein. The substrate apertures 18 extend from the first substrate side 14 to the second substrate side 16. In the embodiment as shown in FIGS. 1 and 2, the substrate apertures 18 are positioned substantially in linear alignment along an edge of the substrate 12. Alternatively, the substrate apertures 18 may be positioned at another location on the substrate 12 and may further be positioned in a non-linear alignment.

A busbar 20 is attached to the first substrate side 14 of the substrate 12. The busbar 20 is configured to transmit relatively high electrical current. The busbar 20 is made of an electrically conductive material. In one embodiment, the busbar 20 is made substantially of a copper-based material. Alternatively, the busbar 20 can be made of any electrically conductive material, such as for example aluminum, sufficient to transmit relatively high electrical current. Optionally, the busbar 20 can be plated with a conductive or a protective material. The plating is configured to protect the busbar from harmful environmental conditions and to further assist the busbar 20 in conducting relatively high electrical current. In one embodiment, the busbar 20 can be plated with tin-based material. In another embodiment, the busbar 20 can be plated with another material, such as for example zinc, sufficient to protect the busbar from harmful environmental conditions and to further assist the busbar 20 in conducting relatively high electrical current.

In one embodiment, the busbar 20 is configured to transmit electrical current in a range from about 1 ampere to about 150 amperes. In another embodiment, the busbar 20 can be configured to transmit electrical current of more or less than 150 amperes. As shown in FIGS. 1 and 2, the busbar 20 has a substantially rectangular cross-sectional shape and has a busbar thickness $t_1$. In another embodiment, the busbar 20 can have any other cross-sectional shape and busbar thickness $t_1$ sufficient to transmit relatively high electrical current.

The busbar 20 can be attached or connected to the substrate by any suitable manner, such as for example soldering. Alternatively, the busbar 20 can be attached to the substrate by mechanical fasteners, such as rivets, pins or screws.

As further shown in FIGS. 1 and 2, the busbar 20 includes a first busbar side 22 and a second busbar side 24. The busbar side 22 and the second busbar side 24 are substantially parallel to each other, although such is not necessary for the invention. The busbar 20 includes a plurality of busbar apertures 26. The busbar apertures 26 extend from the first busbar side 14 to the second busbar side 24. As shown in FIGS. 1 and 2, the busbar apertures 26 are positioned substantially in linear alignment and generally corresponding to the substrate apertures 18. Each busbar aperture 26 defines a wall 28 formed within the busbar 20. The wall 28 extends from the first busbar side 14 to the second busbar side 24. As shown in FIGS. 1 and 2, the busbar apertures 26 and the walls 28 have a generally cylindrical shape but it should be understood that they may be formed having any cross-sectional shape.

As further shown in FIGS. 1 and 2, one or more electrically conductive layers or traces 30 are attached to the second side 16 of the substrate 12. The trace(s) 30 is formed to connect a pre-determined number of components or circuits (not shown) together mounted on the substrate 12 or connected thereto. The traces define an electrical connection grid for the various components or circuits. The traces 30 may be made from copper and can be applied to portions of the substrate 12 that are electrically non-conducting by various methods including silk screening, photoengraving and printed circuit board milling. Alternatively, other methods of joining the traces to the substrate 12 can be used. In a first embodiment, the portions of the substrate 12 upon which the traces are connected to comprise fiberglass material. In another embodiment, ceramic or polymer materials may be used to sufficiently insulate the electrically conductive layers. In this embodiment, the trace 30 is made of an electrically conductive material, such as for example copper. In another embodiment, the trace 30 can be made of another material, such as aluminum. The trace 30 can be of any shape, configuration, or thickness, sufficient to electrically connect predetermined components and circuits. As an alternate embodiment, the substrate may be formed having multiple layers of electrically non-conducting material with traces therebetween forming a multi-layer substrate (not shown)

The trace 30 includes a first trace side 32 and a second trace side 34. The first trace side 32 and the second trace side 34 are substantially parallel to each other, although such is not necessary for the invention. The trace 30 includes a plurality of trace apertures 36. The trace apertures 36 extend from the first trace side 32 to the second trace side 34. As shown in FIGS. 1 and 2, the trace apertures 36 are positioned corresponding to the substrate apertures 18. Each trace aperture 36 defines a trace wall 37 formed within the trace 30. The trace wall 37 extends from the first trace side 32 to the second trace side 34. The trace wall 37 can have any cross-sectional shape. As best shown in FIG. 2, the trace 30 has a trace thickness $t_2$ extending between sides 32 and 34. The trace thickness $t_2$ is sized relative to the anticipated electrical current passing through the trace 30.

The electrical connection system 10 further includes one or more electrical connectors, represented by three different types of connectors 40, 50, and 52. Each of the connectors 40, 50, and 52 include a main or upper portion 48 configured to connect to a mating connector (not shown) or an electrical wire (not shown). The upper portions 48 can be formed as a spade connector, a wire wrap post, a crimp connector or nay other suitably shaped formation sufficient for connection to a mating connector or to an electrical wire. For simplicity, only the individual connector 40 will be described in detail below with respect to the system 10.

The electrical connector 40 has a pin section, indicated generally at 42. The pin section 42 and the upper portion 48 define a shoulder 43 therebetween which may be in direct contact with the first side 22 of the busbar 20, thereby providing additional electrical communication between the busbar 20 and the connector 40.

The pin section 42 is configured to provide for a resilient connection with the busbar 20. As shown in FIGS. 1 and 2, the electrical connectors 40, 50, and 52 can be configured with a single pin section 42 or multiple pin sections 42. The pin sections 42 are generally disposed in the apertures 26, 18, and 36 of the busbar 20, substrate 12 and the trace 30, respectfully.

The pin section 42 includes a resilient portion, indicated generally at 44. The resilient portion 44 is configured to elastically deform when press-fit into the busbar aperture 26, thereby frictionally retaining the connector 40 to the busbar 20. In the embodiment shown, the resilient portion 44 is defined by a pair of outwardly extending tabs 60 separated by an opening 62. In operation, as the electrical connector 40 is inserted into the aperture 26 of the busbar 20, the tabs 60 are forced slightly inwardly towards each other, thereby frictionally retaining the electrical connector 40 to the busbar 20. The outer ends of the tabs 60 contact and engage with the wall 28 of the busbar 20, thereby providing electrical communication between the busbar 20 and the connector 40.

The connector 40 is also electrically connected with the trace 30. In one embodiment, the pin section 42 may also include an end portion 46 to provide this electrical connection. The end portion 46 is disposed through the substrate aperture 18 and the trace aperture 36. The end portion 46 may directly contact the trace wall 37, thereby providing an electrical contact with the trace 30. Alternatively, the end portion 46 may be electrically connected to the trace 30 by a solder connection 70 (as shown with respect to the connector 50). In this embodiment, the end portion 46 is attached to the trace 30 by soldering. In yet another alternate embodiment, the end portion 46 of the pin section 42 is generally flush with the second trace side 34 (as shown with respect to the connector 40).

In operation, the busbar thickness $t_1$ is relatively thick compared to the trace thickness $t_2$. This difference in thickness has the advantage that the relatively thicker busbar 20 allows relatively higher electrical current to be carried by the busbar 20 and permits the relatively lower electrical current to be carried by the trace 30 as compared to conventional printed circuit boards that do not have such a busbar. For these conventional printed circuit boards, the traces are thicker and larger to accommodate the higher electrical current. Forming thicker traces increases the manufacturing cost as well as increases the material cost of the traces. Accordingly, the thickness $t_2$ of the trace 30 can be reduced in the present invention resulting in a less expensive electrical connection system 10.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An electrical connection assembly comprising:
a substrate formed from an electrically non-conductive material and having a first side, a second side, and a substrate aperture extending from the first side to the second side;
a busbar formed from an electrically conductive material and secured to the first side of the substrate, the busbar having a busbar aperture extending therethrough that is aligned with the substrate aperture;
a trace formed from an electrically conductive material and secured to the second side of the substrate; and
a pin formed from an electrically conductive material and extending through both the substrate aperture and the busbar aperture, the pin including a resilient portion that is disposed in the busbar aperture and engages an inner wall defined by the busbar aperture, the pin further including an end portion that extends from the resilient portion and is electrically connected to the trace.

2. The electrical connection assembly defined in claim 1 wherein the resilient portion is defined by a pair of outwardly extending tabs separated by an opening.

3. The electrical connection assembly defined in claim 1 wherein the resilient portion of the pin is deformed when disposed in the busbar aperture so as to exert a force against the inner wall defined by the busbar aperture and thereby frictionally retain the pin to the busbar.

4. The electrical connection assembly defined in claim 1, wherein the resilient portion is defined by a pair of outwardly extending tabs in contact with the inner wall.

5. The electrical connection assembly defined in claim 1 wherein the thickness of the trace adjacent to the pin is substantially less than the thickness of the busbar adjacent to the pin.

6. The electrical connection assembly defined in claim 1 wherein the pin includes a shoulder that contacts the busbar.

7. The electrical connection assembly defined in claim 1 wherein the trace includes a trace aperture, and wherein the pin extends through the trace aperture.

8. The electrical connection assembly defined in claim 7 wherein the pin is soldered to the trace.

9. An electrical connection assembly comprising:
an electrically non-conductive substrate having a first side, a second side having an electrically conductive trace provided thereon, and a substrate aperture that extends from the first side to the electrically conductive trace provided on the second side;
an electrically conductive busbar that is secured to the first side of the substrate, the busbar having a busbar aperture that extends therethrough and is aligned with the substrate aperture; and
an electrically conductive pin that extends through both the substrate aperture and the busbar aperture, the electrically conductive pin including a resilient portion that engages an inner wall defined by the busbar aperture such that the electrically conductive pin is electrically connected to the electrically conductive busbar, the electrically conductive pin also including an end portion that extends from the resilient portion and is electrically connected to the electrically conductive trace provided on the second side of the electrically non-conductive substrate.

10. The electrical connection assembly defined in claim 9 wherein the resilient portion is defined by a pair of outwardly extending tabs separated by an opening.

11. The electrical connection assembly defined in claim 9 wherein the resilient portion of the electrically conductive pin is deformed when disposed in the busbar aperture so as to exert a force against the inner wall defined by the busbar aperture and thereby frictionally retain the electrically conductive pin to the electrically conductive busbar.

12. The electrical connection assembly defined in claim 9 wherein the resilient portion is defined by a pair of outwardly extending tabs in contact with the inner wall.

13. The electrical connection assembly defined in claim 9 wherein the thickness of the electrically conductive trace adjacent to the electrically conductive pin is substantially less than the thickness of the electrically conductive busbar adjacent to the electrically conductive pin.

14. The electrical connection assembly defined in claim 9 wherein the electrically conductive pin includes a shoulder that contacts the electrically conductive busbar.

15. The electrical connection assembly defined in claim 9 wherein the electrically conductive trace includes a trace aperture, and wherein the end portion of the electrically conductive pin extends through the trace aperture.

16. The electrical connection assembly defined in claim 15 wherein the end portion of the electrically conductive pin is soldered to the electrically conductive trace.

\* \* \* \* \*